United States Patent [19]
Ono et al.

[11] Patent Number: 5,792,695
[45] Date of Patent: Aug. 11, 1998

[54] MANUFACTURING METHOD OF A SEMICONDUCTOR EPROM DEVICE

[75] Inventors: Masahiro Ono, Sawa-gun; Masaji Sakamura, Tatebayashi; Toshiharu Matsuda, Oura-gun, all of Japan

[73] Assignee: Sanyo Electric Co., Ltd., Osaka, Japan

[21] Appl. No.: 866,425

[22] Filed: May 30, 1997

[30] Foreign Application Priority Data

May 31, 1996 [JP] Japan .................. 8-139207
Mar. 18, 1997 [JP] Japan .................. 9-065042

[51] Int. Cl.$^6$ ...................... H01L 21/336; H01L 21/8247
[52] U.S. Cl. ............................... 438/257; 438/261
[58] Field of Search .............................. 438/257–267; 257/314–321, 324

[56] References Cited

U.S. PATENT DOCUMENTS

| | | | |
|---|---|---|---|
| 4,957,877 | 9/1990 | Tam et al. | 438/264 |
| 5,029,130 | 7/1991 | Yeh | 365/185 |
| 5,045,488 | 9/1991 | Yeh | 438/257 |
| 5,067,108 | 11/1991 | Jenq | 365/185 |
| 5,427,966 | 6/1995 | Komori et al. | 438/257 |
| 5,552,331 | 9/1996 | Hsu et al. | 438/258 |

FOREIGN PATENT DOCUMENTS 5267868  10/1993  Japan .

Primary Examiner—Joni Chang
Attorney, Agent, or Firm—Loeb & Loeb LLP

[57] ABSTRACT

A first convex portion and a second convex portion are formed on a semiconductor substrate at a prescribed interval, an impurity diffusing region is formed on an upper portion of the semiconductor substrate placed between the first and second convex portions, and a thinned first polysilicon film is formed on the impurity diffusing region and the first and second convex portions. Thereafter, arsenic ions are implanted into the first polysilicon film to make the first polysilicon film conductive. Thereafter, a second polysilicon film having a film thickness larger than that of the first polysilicon film is formed, and phosphorus ions are implanted into the second polysilicon film to make the second polysilicon film conductive. Thereafter, a tungsten silicide film is formed on the second polysilicon film, and the tungsten silicide film and the first and second polysilicon films are patterned. Therefore, a two-layer structured electrode wiring film composed of a patterned tungsten silicide film and a combination of a patterned first polysilicon film and a patterned second polysilicon film is formed. Because the first polysilicon film is thinned, the first polysilicon film can be sufficiently conductive. Therefore, the first polysilicon film is electrically connected with the second polysilicon film on the first and second convex portions even though the second polysilicon film is not sufficiently conductive, and the electrode wiring film can be electrically connected with the impurity diffusing region.

4 Claims, 12 Drawing Sheets

F I G. 12
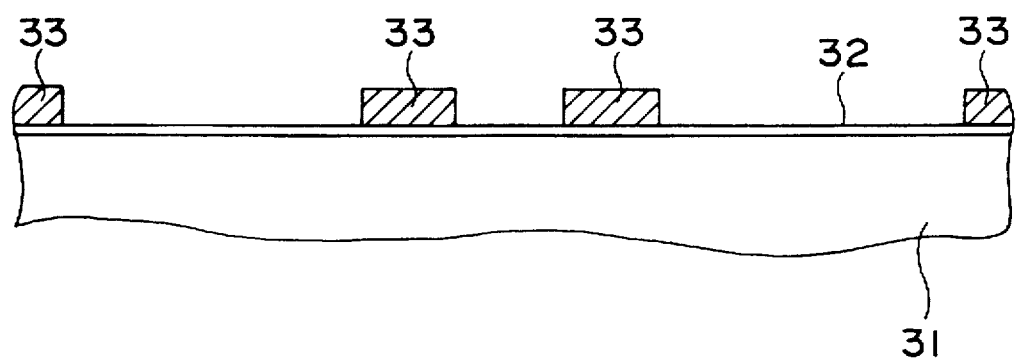
F I G. 13
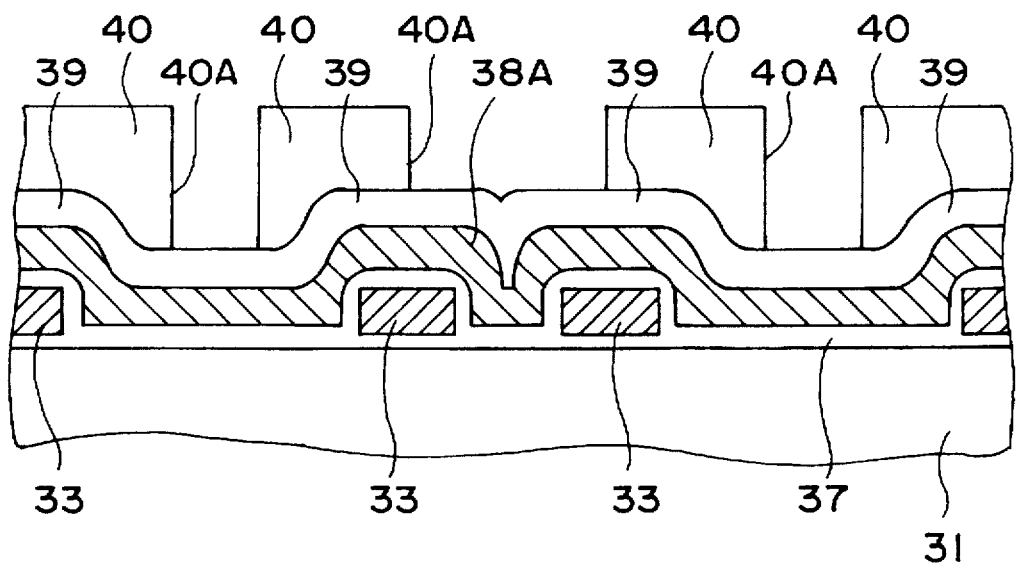

F I G. 14
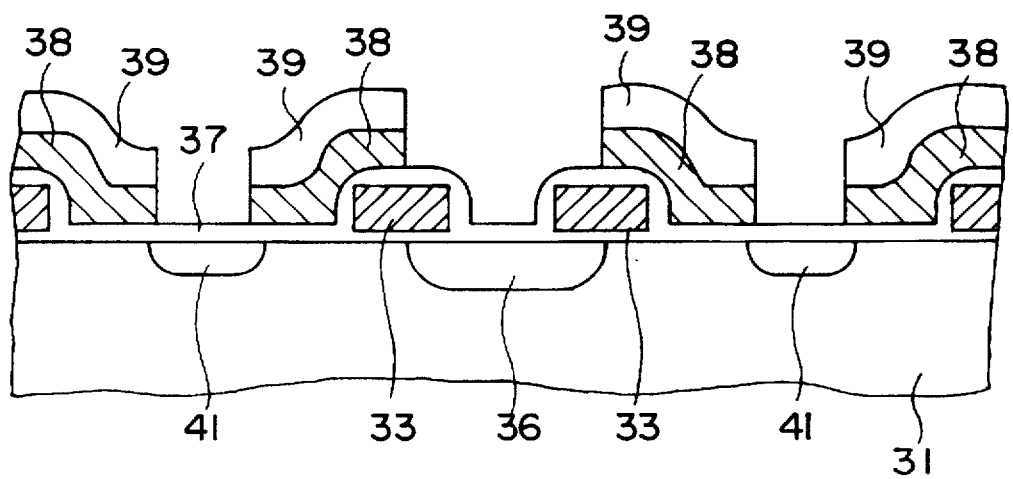
F I G. 15
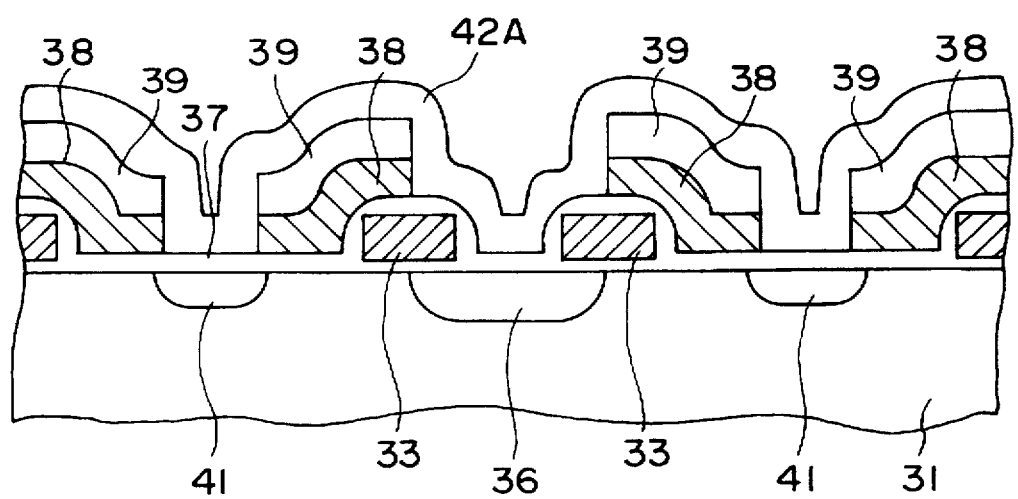

FIG. 16
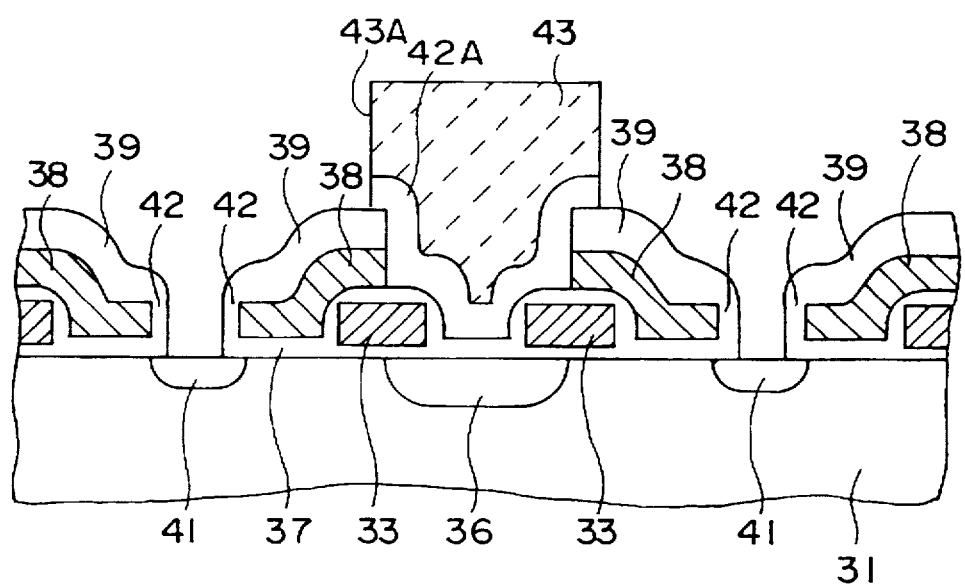
FIG. 17
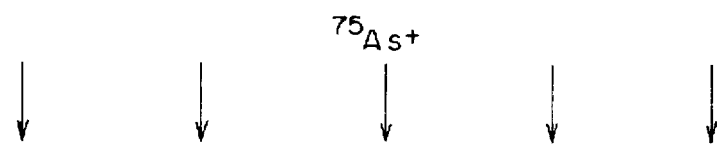
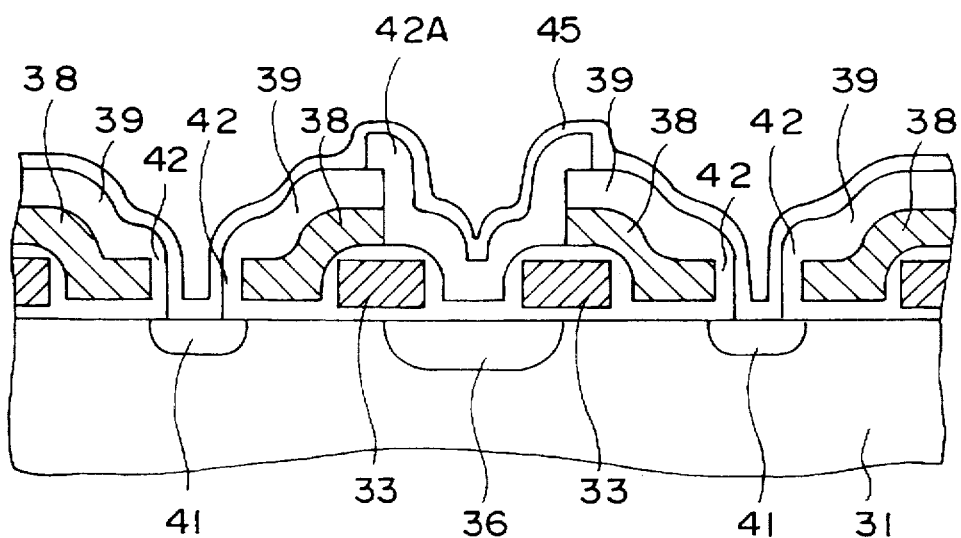

F I G. 18
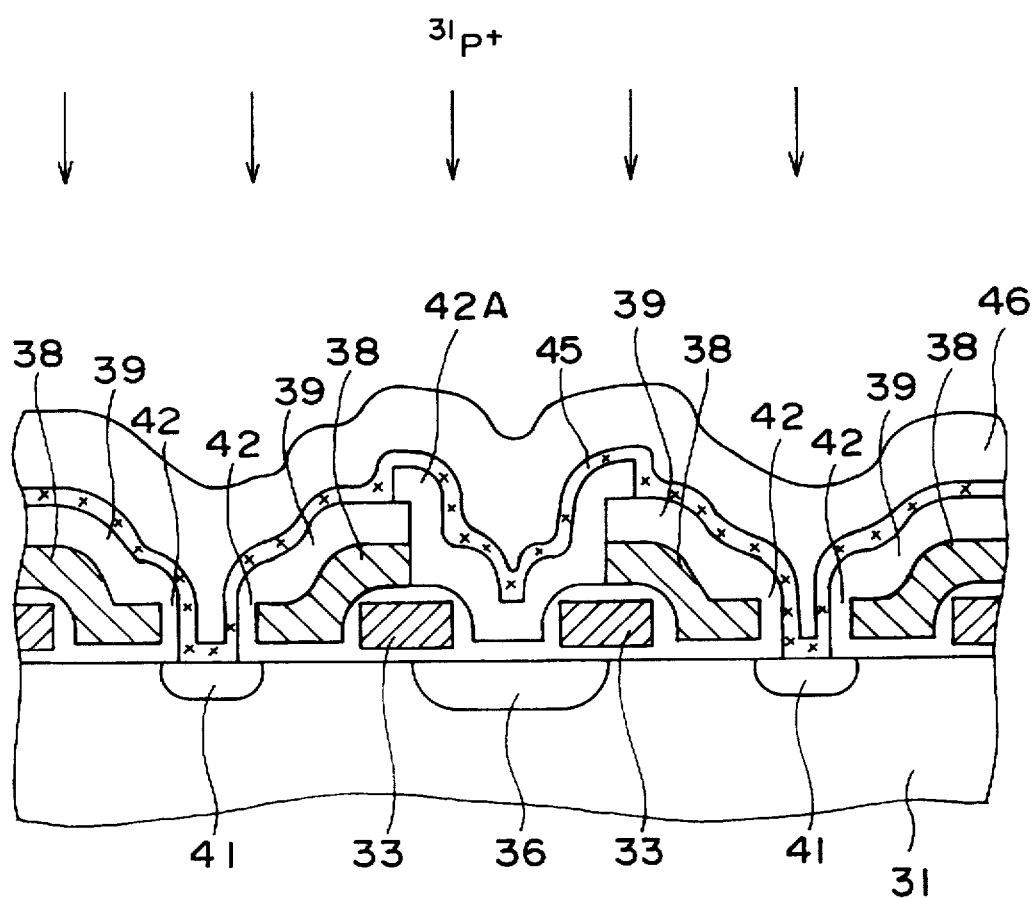

MANUFACTURING METHOD OF A SEMICONDUCTOR EPROM DEVICE

BACKGROUND OF THE INVENTION

1. Field of the Invention

The present invention relates generally to a manufacturing method of a semiconductor apparatus, and more particularly to a method in which a two-layer structured electrode wiring film including a silicide film such as a combination of a polysilicon film and a tungsten silicide (WSix) film is formed.

2. Description of the Prior Art

A conventional semiconductor apparatus is described with reference to FIG. 1.

As shown in FIG. 1, an impurity diffusing region 2 is formed on an upper surface of a semiconductor substrate 1, two MOS transistors are formed on the semiconductor substrate 1 to be adjacent to the impurity diffusing region 2, a two-layer structured electrode wiring film 9A composed of a polysilicon film 8 making contact with the impurity diffusing region 2 and a tungsten silicide (WSix) film 9 is formed between the MOS transistors.

In detail, the impurity diffusing region 2 is formed by implanting n+ impurity into an upper portion of the semiconductor substrate 1, a gate insulating film 3 is formed on the semiconductor substrate 1 so as to expose the impurity diffusing region 2, and a first gate electrode 4A and a second gate electrode 4B facing each other are formed on the gate insulating film 3. Also, a first insulating film 5A is formed on the first gate electrode 4A, and a second insulating film 5B is formed on the second gate electrode 4B. Also, a first side wall spacer film 7A is formed on a side wall of a combination of the first gate electrode 4A and the first insulating film 5A, and a second side wall spacer film 7B is formed on a side wall of a combination of the second gate electrode 4B and the second insulating film 5B on condition that the first and second side walls 7A and 7B face each other.

Also, the electrode wiring film 9A composed of the polysilicon film 8 and the tungsten silicide (WSix) film 9 is formed on the impurity diffusing region 2. In the polysilicon film 8, impurity is implanted to make the polysilicon film 8 conductive, so that the polysilicon film 8 electrically connected with the impurity diffusing region 2.

In addition, a first wiring film 6A is formed on the first insulating film 5A, a second wiring film 6B is formed on the second insulating film 5B, and the first and second wiring films 6A and 6B and the first and second insulating films 5A and 5B are covered with an inter-layer insulating film 10A made of boron-phoso silicate glass.

Also, after a photo-resist film (not shown) is formed on the inter-layer insulating film 10A, an opening area is formed in the inter-layer insulating film 10A by using the photo-resist film as a mask so as to expose the electrode wiring film 9A composed of the polysilicon film 8 and the tungsten silicide (WSix) film 9, and the electrode wiring film 9A and the inter-layer insulating film 10A are covered with a metal wiring film 10B made of aluminum or a material including aluminum (for example, Al-Si-Cu) to electrically make the electrode wiring film 9A contact with the metal wiring film 10B.

To obtain a structure of the conventional apparatus shown in FIG. 1, the polysilicon film 8 is formed to be filled in a concave area between the first side wall spacer film 7A formed on the side wall of the combination of the first gate electrode 4A and the first insulating film 5A and the second side wall spacer film 7B formed on the side wall of the combination of the second gate electrode 4B and the second insulating film 5B, ions are implanted in the polysilicon film 8 to make the polysilicon film 8 conductive, and the tungsten silicide (WSix) film 9 is formed on the polysilicon film 8. Thereafter, after a photo-resist film is formed on the tungsten silicide film 9, the tungsten silicide film 9 and the polysilicon film 8 are patterned by etching and removing a portion of the tungsten silicide film 9 and a portion of the polysilicon film 8 while using the photo-resist film as a mask. Therefore, as shown in FIG. 2, the electrode wiring film 9A is formed.

Thereafter, after the inter-layer insulating film 10A is formed over the entire surface of the electrode wiring film 9A and the entire surface of the first and second insulating films 5A and 5B, an opening area is formed in the inter-layer insulating film 10A to expose the tungsten silicide film 9, an aluminum film is formed over the entire surface of the tungsten silicide film 9 and the entire surface of the inter-layer insulating film 10A and is patterned. Therefore, the metal wiring film 10B electrically connected with the electrode wiring film 9A is formed.

However, in cases where the conventional semiconductor apparatus is manufactured according to the above method, there are many drawbacks. That is, it is required to thin the polysilicon film 8 to arrange the electrode wiring film 9A composed of the polysilicon film 8 and the tungsten silicide (WSix) film 9 in the conventional semiconductor apparatus. In this case, because a film thickness of the polysilicon film 8 is made small, as shown in FIG. 2, a ravine area CP is formed on the tungsten silicide (WSix) film 9 when the tungsten silicide (WSix) film 9 is formed on the polysilicon film 8. Therefore, when a photo-resist film planned to be used as a mask in a patterning operation of the electrode wiring film 9A is patterned in a photo-lithography process by exposing the photo-resist film to light, the photo-resist film undesirably remains in the ravine area CP, so that there is a first drawback that the electrode wiring film 9A cannot be reliably patterned. To prevent this drawback, in cases where an intensity of the exposing light is increased, halation occurs in the exposing operation, so that there is another drawback that the photo-resist film is not correctly patterned and the electrode wiring film 9A cannot be patterned with high accuracy.

Also, because a film thickness of the polysilicon film 8 is made small, a height of the electrode wiring film 9A is lowered. Therefore, as shown in FIG. 1, a height a1 of a side wall of the inter-layer insulating film 10A is heightened, an opened area surrounded by the side wall of the inter-layer insulating film 10A is deepened. In this case, there is a second drawback that a step coverage of the metal wiring film 10B arranged on the side wall of the inter-layer insulating film 10A is degraded.

To avoid the first and second drawbacks, as shown in FIG. 3, there is an idea that a polysilicon film 8A placed beneath the tungsten silicide (WSix) film 9 is thickened.

However, in an ion implanting process performed to make the polysilicon film 8A conductive, though ions are sufficiently implanted in an upper portion of the polysilicon film 8A, ions are not sufficiently implanted into a bottom portion PB of the polysilicon film 8A near to the impurity diffusing region 2. Also, ions are not sufficiently diffused from the bottom portion PB of the polysilicon film 8A to the substrate 1. Therefore, the polysilicon film 8A is not sufficiently made conductive. Accordingly, there is another drawback that a contact resistance of the polysilicon film 8A becomes higher than a desired value. Also, there is another drawback that contact resistances in various portions of the polysilicon film 8A cannot be uniformly set because implanting amounts of ion in the various portions of the polysilicon film 8A differ from each other.

To sufficiently inject ions into the bottom portion PB of the polysilicon film 8A, there is an idea that an acceleration voltage applied to the ions is heightened.

However, in this case, an amount of ion implanted into the impurity diffusing region 2 placed beneath the polysilicon film 8A is increased, the ions implanted into the impurity diffusing region 2 are diffused in a lateral direction, so that there is another drawback that a punch through occurs in the MOS transistors of the conventional semiconductor apparatus. Also, to prevent the implantation of ions into the first and second gate electrodes 4A and 4B through the first and second insulating films 5A and 5B, it is required to cover a region other than an ion implanting region positioned on the electrode wiring film 9A with a photo-resist. Therefore, there is another drawback that the number of manufacturing processes is increased by adding a masking process.

SUMMARY OF THE INVENTION

An object of the present invention is to provide, with due consideration to the drawbacks of such a conventional semiconductor apparatus, a semiconductor apparatus in which a two-layer structured electrode wiring film composed of a silicide film and a polysilicon film is arranged to be electrically connected with an impurity diffusing region on condition that the polysilicon film is sufficiently thickened and contact resistances in various portions of the polysilicon film are uniformly set to a low value.

In a manufacturing method of a semiconductor apparatus according to the present invention, a first thinned polysilicon film is formed on a first convex portion, a second convex portion and an impurity diffusing region, ions are implanted into the first polysilicon film to make the first polysilicon film conductive, a second polysilicon film having a film thickness larger than that of the first polysilicon film is formed on the first polysilicon film, ions are implanted into the second polysilicon film to make the second polysilicon film conductive, and a silicide film is formed on the second polysilicon film. Therefore, even though a total thickness of the first and second polysilicon films is made large and a height of an electrode wiring-film composed of the silicide film and the first and second polysilicon films is heightened, a contact resistance of a group of the first and second polysilicon films can be made small and set to a desired value.

Therefore, because it is not required to thin the group of the first and second polysilicon films for the purpose of maintaining the contact resistance of the group of the first and second polysilicon films to a low value, there is no case that a photo-resist film planned to be used as a mask in a patterning operation of the electrode wiring film is incorrectly patterned in a photo-lithography process. Also, because a height of a side wall of an inter-layer insulating film surrounding an opening area placed on the electrode wiring film is not heightened, the depth of the opening area is not deepened, so that there is no case that a step coverage of a metal wiring film formed on the inter-layer insulating film along the side wall of the inter-layer insulating film is degraded.

Also, because the ions can be uniformly implanted into each of the first and second polysilicon films, contact resistances in various portions of each polysilicon film can be uniformly set. Therefore, conductivity of each of the first and second polysilicon films can be uniformly set.

Also, in cases where the semiconductor apparatus according to the present invention is applied for a non-volatile semiconductor memory, when an electrode wiring film composed of a silicide film and a polysilicon film making contact with a small contact hole is formed on an impurity diffusing region formed according to a self-aligning process such as a drain region, an ion implanting process performed to make the polysilicon film conductive can be stabilized, the reliability of the apparatus can be improved, a contact resistance of the polysilicon film can be lowered, and data writing and reading operations can be performed in the storing apparatus with a high speed.

BRIEF DESCRIPTION OF THE DRAWINGS

FIG. 12 is a second cross sectional view of the semiconductor apparatus in a first manufacturing process according to the second embodiment of the present invention.

FIG. 13 is a third cross sectional view of the semiconductor apparatus in a second manufacturing process according to the second embodiment of the present invention.

FIG. 14 is a fourth cross sectional view of the semiconductor apparatus in a third manufacturing process according to the second embodiment of the present invention.

FIG. 15 is a fifth cross sectional view of the semiconductor apparatus in a fourth manufacturing process according to the second embodiment of the present invention.

FIG. 16 is a sixth cross sectional view of the semiconductor apparatus in a fifth manufacturing process according to the second embodiment of the present invention.

FIG. 17 is a seventh cross sectional view of the semiconductor apparatus in a sixth manufacturing process according to the second embodiment of the present invention.

FIG. 18 is an eighth cross sectional view of the semiconductor apparatus in a seventh manufacturing process according to the second embodiment of the present invention.

DESCRIPTION OF THE PREFERRED EMBODIMENTS

Preferred embodiments of a semiconductor apparatus according to the present invention are described with reference to drawings.

(First Embodiment)

In a semiconductor apparatus according to the first embodiment, two MOS transistors are formed on a semiconductor substrate on condition that the MOS transistors is adjacent to an impurity diffusing region formed in an upper portion of the semiconductor substrate, and a two-layer structured electrode wiring film composed: of a polysilicon film and a tungsten silicide (WSix) film is formed on the semiconductor substrate and the MOS transistors on condition that the polysilicon is made contact with the impurity diffusing region.

Figure 4:
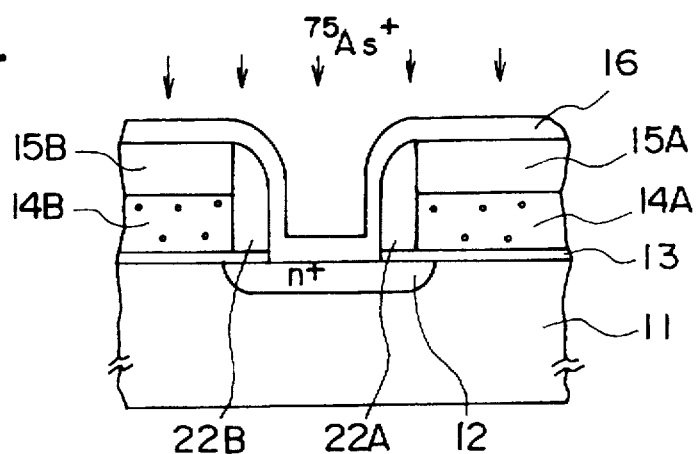
FIG. 4 is a first cross sectional view of a semiconductor apparatus in a first manufacturing process according to a first embodiment of the present invention.

A plurality of manufacturing steps performed to obtain a structure of a semiconductor apparatus shown in FIG. 4 are initially described.

An upper portion of a semiconductor substrate 11 is oxidized to form a gate insulating film 13 having a film thickness of about 100 Å, and a polysilicon film having a film thickness of about 2500 Å is formed on the gate insulating film 13. The polysilicon film is planned to function as gate electrodes of MOS transistors.

Next, an oxide film having a film thickness of about 2500 Å is formed on the polysilicon film, and the polysilicon film and the oxide film are patterned to form a first gate electrode 14A and a second gate electrode 14B, and a first and second insulating films 15A and 15B are formed on the first gate electrode 14A and the second gate electrode 14B respectively.

The gate electrodes 14A and 14B are planned to be adjacent to both ends of an n+ type impurity diffusing region 12 through the gate insulating film 13.

Thereafter, impurity is implanted into an upper portion of the semiconductor substrate 11 placed between the first and second gate electrodes 14A and 14B and is diffused in the semiconductor substrate 11. Therefore, the n+ type impurity diffusing region 12 is formed. In this impurity diffusing region forming step, an n-type impurity such as phosphorus ions ($_{31}P^+$) is implanted into the upper portion of the semiconductor substrate 11 at a dose of $1.0*10^{13}$ cm$^{-2}$ and an accelerating voltage of 40 KeV while using the first and second gate electrodes 14A and 14B and the first and second insulating films 15A and 15B as a mask, the semiconductor substrate 11 is annealed to diffuse the n-type impurity into the semiconductor substrate 11, so that the n+ type impurity diffusing region 12 is formed.

In this embodiment, phosphorus ions ($^{31}P^+$) are used as the n-type impurity. However, it is applicable that arsenic ions ($^{75}$As+) be implanted into the semiconductor substrate 11 at a dose of $5.0*10^{15}$ cm$^2$ and an accelerating voltage of 60 KeV.

Thereafter, an insulating film (or an oxidized film) having a film thickness of about 2000 Å is formed on the entire surface of the semiconductor apparatus according to a CVD method, and an anisotropic etching is performed for the insulating film to form a first side wall spacer film 22A on side walls of the first gate electrode 14A and the first insulating film 15A and form a second side wall spacer film 22B on side walls of the second gate electrode 14B and the second insulating film 15B. Thereafter, as shown in FIG. 4, a first polysilicon layer 16 is formed on the entire surface of the semiconductor apparatus at a film thickness ranging from 200 Å to 500 Å according to the CVD method, and an n-type impurity such as arsenic ions ($^{75}$As+) is implanted into the first polysilicon layer 16 at a dose of $5.0*10^{15}$ cm$^{-2}$ and an accelerating voltage ranging from 30 KeV to 100 KeV. Therefore, the first polysilicon layer 16 is sufficiently made conductive, and the first polysilicon layer 16 is electrically connected with the n+ type impurity diffusing region 12.

As an optimum condition of the implantation of the n-type impurity, in cases where the film thickness of the first polysilicon layer 16 is, for example, 500 Å, arsenic ions ($^{75}$As+) are implanted into the first polysilicon layer 16 as a first ion implantation at a dose of $5.0*10^{15}$ cm$^{-2}$ and an accelerating voltage of 30 KeV, and arsenic ions ($^{75}$As+) are implanted into the first polysilicon layer 16 as a second ion implantation at a dose of $5.0*10^{15}$ cm$^{-2}$ and an accelerating voltage of 95 KeV. Therefore, a peak of a concentration distribution of the arsenic ions in the first ion implantation is positioned at the center of the first polysilicon layer 16, and a peak of a concentration distribution of the arsenic ions in the second ion implantation is positioned at an interface between a bottom portion of the first polysilicon layer 16 and the semiconductor substrate 11. Accordingly, contact resistances in various portions of the first polysilicon layer 16 can be uniformly set to a low value.

In this embodiment, arsenic ions ($^{75}$As+) are used as the n-type impurity. However, it is applicable that phosphorus ions ($^{31}$P+) be implanted into the first polysilicon layer 16.

Next, an electrode wiring film forming process, in which an electrode wiring film is formed in a concave area placed between a first MOS transistor denoting a first convex portion and a second MOS transistor denoting a second convex portion to be made contact with the n+ type impurity diffusing region 12, is described. In this embodiment, a height of each convex portion is set to about 5000 Å, and a width between the convex portions is set to about 0.4 μm (4000 Å).

Figure 5:
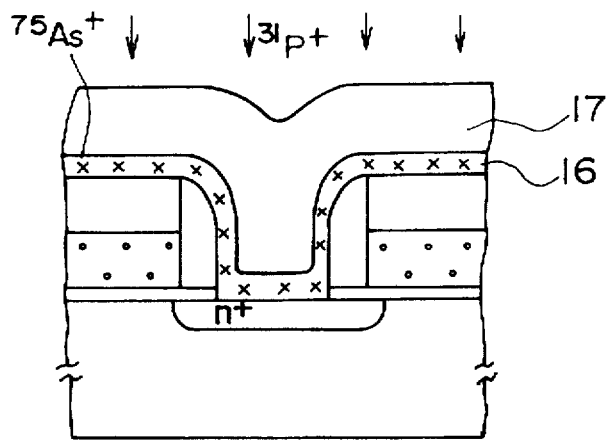
FIG. 5 is a second cross sectional view of the semiconductor apparatus in a second manufacturing process according to the first embodiment of the present invention.
Figure 6:
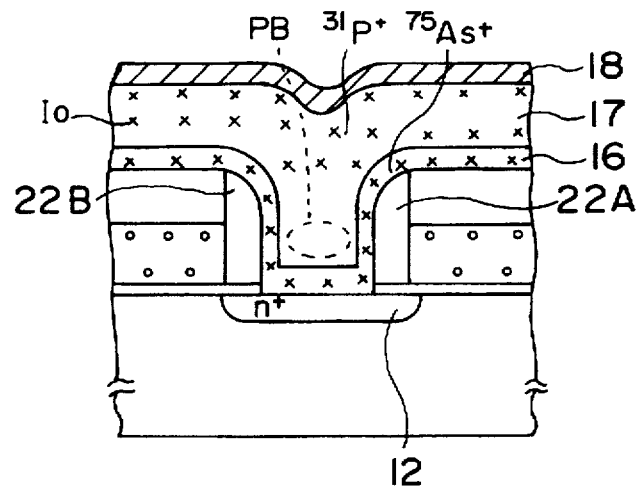
FIG. 6 is a third cross sectional view of the semiconductor apparatus in a third manufacturing process according to the first embodiment of the present invention.

As shown in FIG. 5, a second polysilicon film 17 is formed on the entire surface of the semiconductor apparatus according to the CVD method at a film thickness ranging from 2000 Å to 3000 Å sufficiently larger than that in the first polysilicon film 16, and an n-type impurity such as phosphorus ions ($^{31}$P+) is implanted into the second polysilicon film 17 at a dose of $5.0*10^{15}$ cm$^{-2}$ and an accelerating voltage of 60 KeV. Therefore, the second polysilicon film 17 is made conductive. In this case, the second polysilicon film 17 is sufficiently thickened, so that any narrowed convex portion is not formed on the second polysilicon film 17. Thereafter, as shown in FIG. 6, a tungsten silicide (WSix) film 18 having a film thickness of 1000 Å is formed on the entire surface of the second polysilicon film 17. In this case, it is applicable that arsenic ions ($^{75}$As+) be used as the n-type impurity in place of the phosphorus ions ($^{31}$P+).

In this embodiment, after the first polysilicon film 16 is sufficiently made conductive, the second polysilicon film 17 is formed on the first polysilicon film 16, and the n-type impurity is implanted into the second polysilicon film 17 to made the second polysilicon film 17 conductive. Therefore, as shown in FIG. 6, even though the implantation of the phosphorus ions ($^{31}$P+) into the second polysilicon film 17 is not sufficiently performed and the phosphorus ions ($^{31}$P+) Io do not reach a bottom portion PB of the second polysilicon film 17 (refer to the symbol x in FIG. 6), because the phosphorus ions ($^{31}$P+) Io sufficiently reach portions of the second polysilicon film 17 close to upper ends of the first and second side wall spacer films 22A and 22B, the portions of the second polysilicon film 17 can be electrically connected with the n$^+$ type impurity diffusing region 12 through the first polysilicon film 16.

Figure 3:
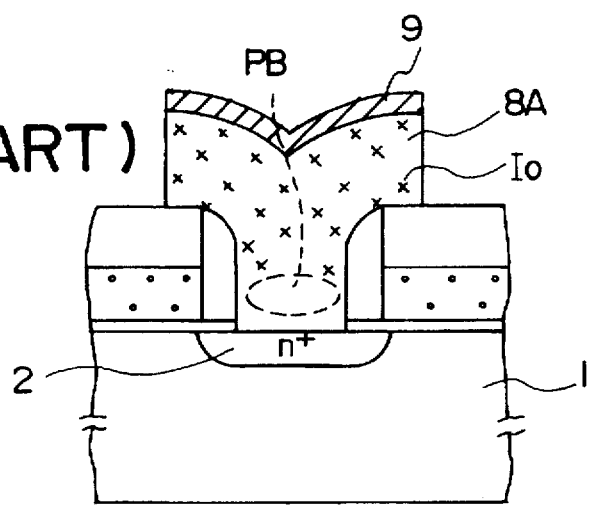
FIG. 3 is a second cross sectional view of another conventional semiconductor apparatus in a manufacturing step to explain another drawback in a manufacturing method of the conventional semiconductor apparatus.

Accordingly, in the prior art shown in FIG. 3, though a contact resistance of the polysilicon film 8A is increased because the n-type impurity does not sufficiently reach the bottom portion PB of the polysilicon film 8A and contact resistances of various portions of the polysilicon film 8A are not uniformly set because the n-type impurity does not uniformly implanted into the bottom portion PB of the polysilicon film 8A, this drawback can be prevented in this embodiment.

Figure 7:
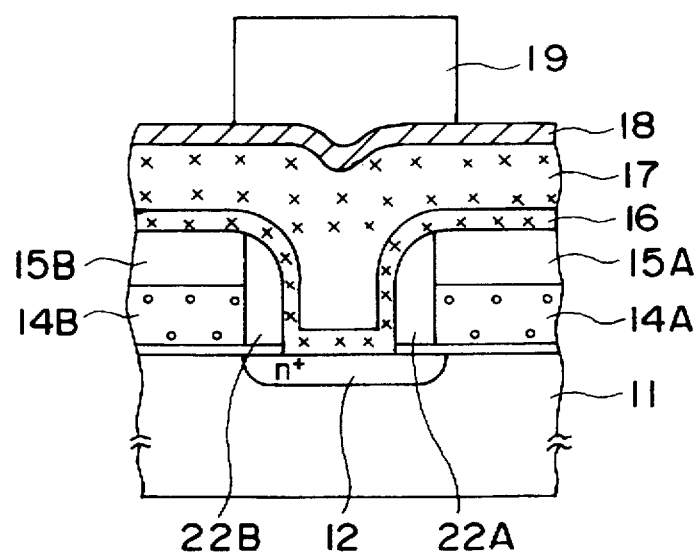
FIG. 7 is a fourth cross sectional view of the semiconductor apparatus in a fourth manufacturing process according to the first embodiment of the present invention.
Figure 8:
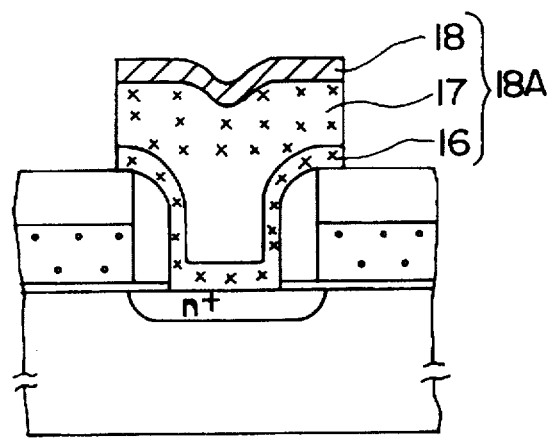
FIG. 8 is a fifth cross sectional view of the semiconductor apparatus in a fifth manufacturing process according to the first embodiment of the present invention.

Thereafter, as shown in FIG. 7, a photo-resist film 19 is formed on a region in which the formation of an electrode wiring film is planned, and portions of the tungsten silicide (WSix) film 18 and the first and second polysilicon films 16 and 17 are etched and removed to pattern the tungsten silicide (WSix) film 18 and the first and second polysilicon films 16 and 17 while using the photo-resist film 19 as a mask. Therefore, as shown in FIG. 8, a two-layer structured electrode wiring film 18A composed of a combination of the polysilicon films 16 and 17 and the tungsten silicide (WSix) film 18 is formed.

In this embodiment, a combined polysilicon film composed of the polysilicon films 16 and 17 is sufficiently thickened. Accordingly, in the prior art shown in FIG. 2, the ravine area CP is formed on the tungsten silicide (WSix) film 9 so that a resist-film used for the patterning of the tungsten silicide (WSix) film 9 undesirably remains in the ravine area CP or a halation occurs in cases where an intensity of the exposing light is increased to prevent the resist-film undesirably remain in the ravine area CP. Therefore, the patterning of the tungsten silicide (WSix) film 9 cannot be correctly performed in the prior art. However, in this embodiment, any narrowed concave area is not formed on the second polysilicon film 17 because the second polysilicon film 17 is sufficiently thickened. Therefore, the patterning of the electrode wiring film 18A can be correctly performed.

Figure 9:
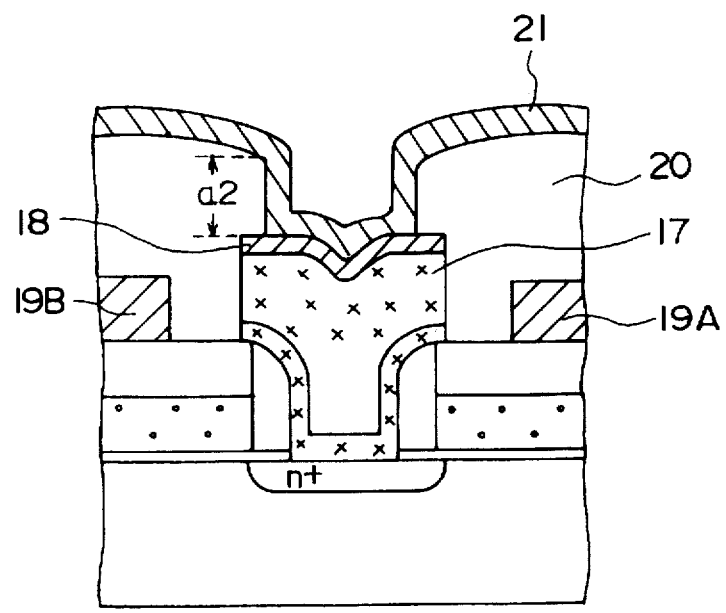
FIG. 9 is a sixth cross sectional view of the semiconductor apparatus in a sixth manufacturing process according to the first embodiment of the present invention.

Thereafter, as shown in FIG. 9, a first wiring film 19A is formed on the first insulating film 15A, a second wiring film 19B is formed on the second insulating film 15B, an inter-layer insulating film 20 made of boron-phoso silicate glass is formed on the entire surface of the semiconductor apparatus, and an opening area is formed in the inter-layer insulating film 20 to expose the electrode wiring film 18A composed of the combined polysilicon film (the polysilicon films 16 and 17) and the tungsten silicide (WSix) film 18. Thereafter, aluminum or Al-Si-Cu is formed on the entire surface of the semiconductor apparatus and is patterned to form a metal wiring film 21. Therefore, the electrode wiring film 18A is electrically connected with the metal wiring film 21, and the manufacturing of the semiconductor apparatus is completed.

Accordingly, as shown in FIG. 9, a height of the electrode wiring film 18A composed of the combined polysilicon film (the polysilicon films 16 and 17) and the tungsten silicide (WSix) film 18 can be heightened, and a height a2 of a side wall of the inter-layer insulating film 20 facing an opening area placed on the electrode wiring film 18A can be lowered than the height a1 of the side wall of the inter-layer insulating film 10A in the prior art (a2 <a1). Therefore, a step coverage of the metal wiring film 21 formed along the side wall of the inter-layer insulating film 20 is not degraded.

In this embodiment, the electrode wiring film 18A is formed by laminating the combined polysilicon film (the polysilicon films 16 and 17) and the tungsten silicide (WSix) film 18. However, it is applicable that an electrode wiring film be formed by laminating the combined polysilicon film and a silicide film other than the tungsten silicide (WSix) film.

Also, in this embodiment, the height of each convex portion is set to about 5000 Å, the width between the convex portions is set to about 0.4 μm (4000 Å), the first polysilicon film 16 is set to the film thickness ranging from 200 Å to 500 Å, and the second polysilicon film 17 is set to the film thickness ranging from 2000 Å to 3000 Å. However, this embodiment is not limited these values. For example, in cases where the height of each convex portion is ranged from 4000 Å to 6000 Å and the width between the convex portions is ranged from 0.1 μm to 0.4 μm (1000 Å to 4000 Å), the same effects as those in the first embodiment can be obtained on condition that the heights of the first and second polysilicon films 16 and 17 are the same as those in the first embodiment. Also, even though the height of each convex portion and the width between the convex portions are changed, in cases where the heights of the first and second polysilicon films 16 and 17 are adjusted according to the changed height of each convex portion and the changed width between the convex portions and ion implanting conditions are adjusted according to the adjusted heights of the first and second polysilicon films 16 and 17, the same effects as those in the first embodiment can be obtained.

Also, in this embodiment, two MOS transistors are formed on the semiconductor substrate 11 to be adjacent to the impurity diffusing region 12 formed on the upper portion of the semiconductor substrate 11, and the two-layer structured electrode wiring film 18A composed of the combined polysilicon film and the tungsten silicide (WSix) film 18 is formed between the two MOS transistors to make contact with the impurity diffusing region 12. However, this embodiment is not limited to this configuration, and it is applicable that a two-layer structured electrode wiring film be formed in a concave area placed between both convex portions. For example, it is applicable that a two-layer structured electrode wiring film be formed in a contact hole surrounded by an insulating film.

(Second Embodiment)

A second embodiment according to the present invention is described with reference to FIGS. 10 to 21.

Figure 10:
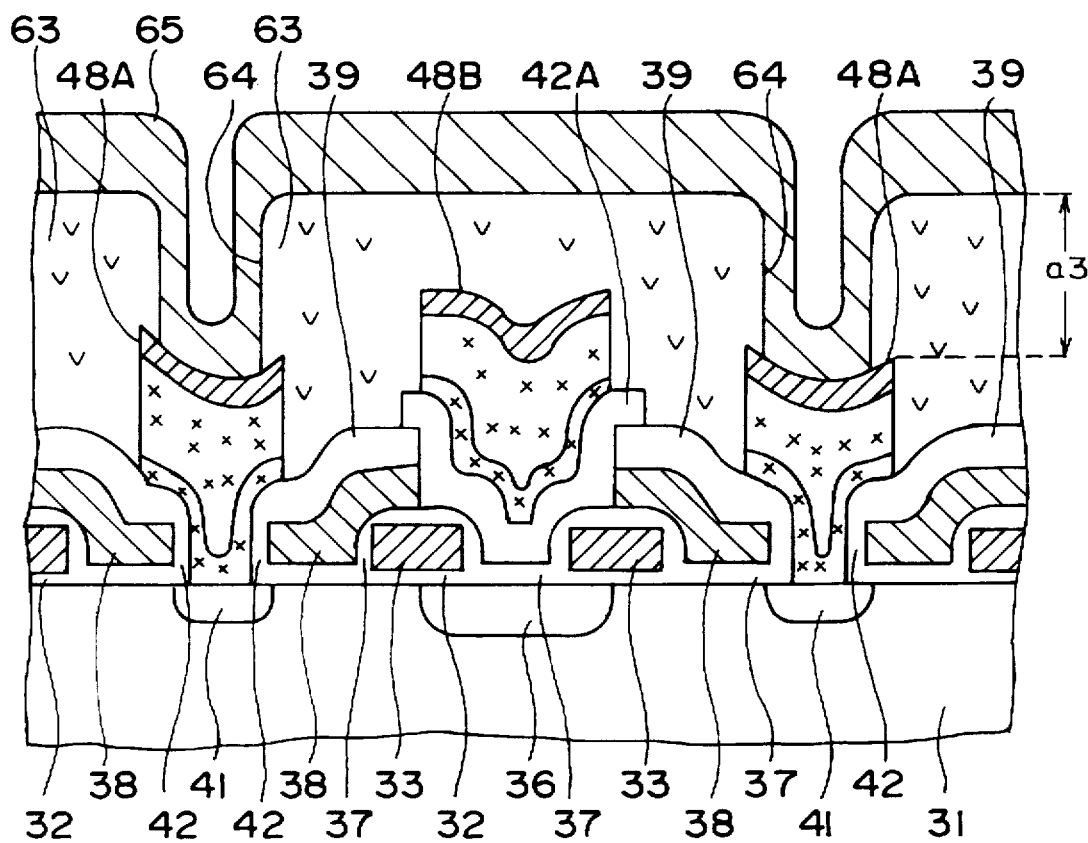
FIG. 10 is a first cross sectional view of a semiconductor apparatus according to a second embodiment of the present invention.
Figure 11:
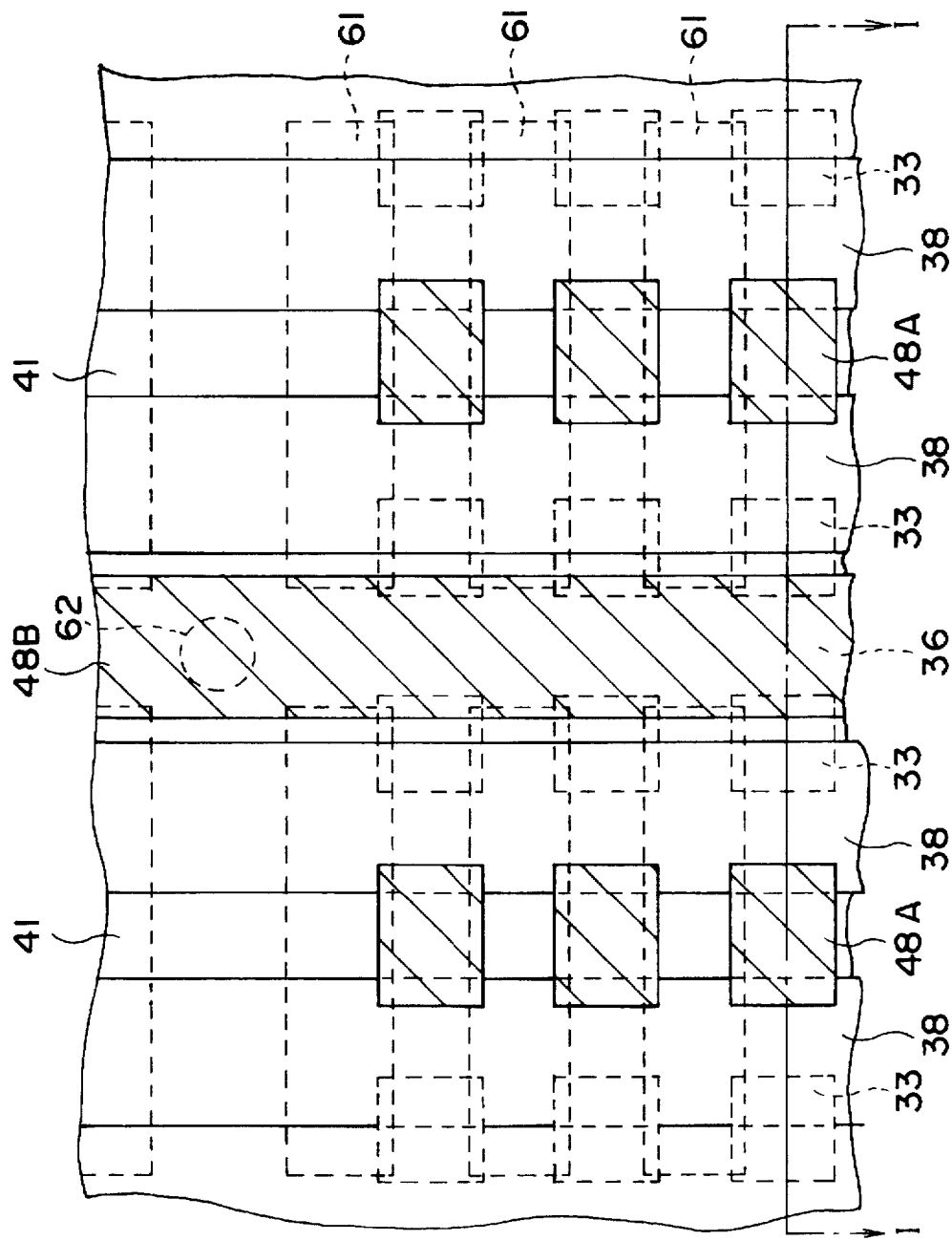
FIG. 11 is a plan view of the semiconductor apparatus according to the second embodiment of the present invention.

FIG. 11 is a plan view of the semiconductor apparatus according to a second embodiment of the present invention, and FIG. 10 is a cross sectional view taken generally along a line I—I of FIG. 11.

In the second embodiment, the electrode wiring film 18A composed of the combined polysilicon film (the polysilicon films 16 and 17) and the tungsten silicide (WSix) film 18 is used in a split gate type flash memory representing a non-volatile semiconductor storing unit. Two convex portions placed on both sides of the electrode wiring film 18A comprise at least control gates of the flash memory.

In detail, as shown in FIG. 10, a plurality of source regions 36 and a plurality of drain regions 41 are alternately formed on upper portions of a semiconductor substrate 31 in an X direction. Each of the source and drain regions 36 and 41 extends toward a Y direction perpendicular to a paper plane and the X direction. Also, a pair of floating gates 33 and a pair of control gates 38 are formed on the semiconductor substrate 31 through a gate insulating film 32 and an insulating film 37 for each source region 36. The control gate 38 extends from an upper side of the floating gate 33 to an outer side of the floating gate 33. A memory cell comprises one source region 36, one drain region 41, one floating gate 33 and one control gate 38 arranged in the X direction. In this case, because two memory cells are formed on both sides of one source region 36, the source region 36 functions as an element common to the two memory cells. Also, as shown in FIG. 11, a field oxidized film 61 is formed between each pair of memory cells arranged in the Y direction. Also, as shown in FIG. 11, the control gates 38 extend in the Y direction. That is, a plurality of control gates 38 of a plurality of memory cells are integrally formed and functioning as a word line of the non-volatile semiconductor storing apparatus.

Each pair of control gates 38 formed on the semiconductor substrate 31 is adjacent to the drain region 41 through one insulating film 37, each pair of insulating films 39 are formed on the pair of control gates 38 to cover the control gates 38, and a two-layer structured electrode wiring film 48A composed of a combined polysilicon film and a tungsten silicide (WSix) film is formed between each pair of control gates 38 to make contact with one drain region 41.

As shown in FIG. 10, the floating gate 33 is covered with the insulating film 37 and the gate insulating film 32, the control gate 38 is covered with the insulating film 39, and an insulating film 42A and a side wall spacer film 42. Also, each first electrode wiring film 48A is formed on one drain region 41 and extends over one insulating film 39 arranged on one control gate 38. Also, a second electrode wiring film 48B is formed on each source region 36 through the insulating films 37 and 42A. Each second electrode wiring film 48B extends over the floating gate 33 or the control gate 38.

In addition, as shown in FIG. 11, each second electrode wiring film 48B is electrically connected with a plurality of contact holes 62 opened in the insulating films 37 and 42A at prescribed intervals (for example, at 16 memory cell intervals) in the Y direction. Therefore, though an operation margin is decreased because of a voltage drop in the source region 36 in the prior art, the decrease of the operation margin can be avoided.

The floating gates 33, the control gates 38, the first electrode wiring films 48A and the second electrode wiring films 48B are covered with an inter-layer insulating film 63. Also, a metal wiring film 65 having a specific pattern is formed on the inter-layer insulating film 63 and is electrically connected with the drain regions 41 through a plurality of contact holes 64 formed and the electrode wiring films 48A. The metal wiring film 65 is made of aluminum or Al-Si-Cu and functions as a bit line of the non-volatile semiconductor storing apparatus.

FIGS. 12 to 21 are cross sectional views showing a manufacturing method of the non-volatile semiconductor storing apparatus in the order of manufacturing steps.

As shown in FIG. 12, a field oxidized film 61 (shown in FIG. 11) is formed on a prescribed region of an upper surface of the semiconductor substrate 31, and the gate insulating film 32 is formed at a film thickness of about 100 Å on the upper surface of the semiconductor substrate 31 other than the field oxidized film 61. Thereafter, a polysilicon film is formed on the insulating film 32 at a film thickness of about 1500 Å phosphorus is doped into the polysilicon film to make the polysilicon film conductive, the polysilicon film is patterned according to a well-known photo-lithography method, and the floating gates 33 are formed.

Thereafter, as shown in FIG. 13, a surface of the substrate 31 is oxidized, the insulating film 37 having a film thickness of 300 Å is formed to cover the floating gates 33. Thereafter, a two-layer structured conductive film 38A composed of a polysilicon film and a tungsten silicide (WSix) film is formed on the entire surface of the substrate 31. In this case, the two-layer structured conductive film 38A is obtained by forming a polysilicon film at a film thickness of about 1000 Å, doping phosphorus into the polysilicon film by using $POCl_3$ as a diffusing source and forming the tungsten silicide (WSix) film on the polysilicon film at a film thickness of about 1200 Å. Thereafter, the insulating film 39 having a film thickness of about 2500 Å is formed on the conductive film 38A, a photo-resist film 40 is formed on the insulating film 39, and a plurality of opening areas 40A are formed in portions of the photo-resist film 40 placed on regions planned to be used as the source and drain regions.

Thereafter, the insulating film 39 and the conductive film 38A are etched while using the resist film 40 as a mask. Therefore, as shown in FIG. 14, the control gates 38 obtained by etching the conductive film 38A are formed, and the etched insulating film 39 is arranged on the control gates 38. Thereafter, the resist film 40 is removed, regions on areas planned to be used for the drain regions are covered with a photo-resist film (not shown), an n-type impurity such as phosphorus ions ($^{31}P+$) is implanted into an upper portion of the substrate 31 at a dose of $5.0*10^{15}$ $cm^{-2}$ and an accelerating voltage of 60 KeV, the substrate 31 is annealed to diffuse the implanted n-type impurity, so that the source regions 36 are formed. In this case, it is applicable that arsenic ions ($^{75}As+$) be implanted as the n-type impurity.

Thereafter, the photo-resist film is removed, areas on the source regions 36 are covered with a photo-resist film (not shown), phosphorus ions ($^{31}P+$) are implanted into an upper portion of the substrate 31 at a dose of $1.0*10^{13}$ $cm^2$ and an accelerating voltage of 40 KeV, the substrate 31 is annealed to diffuse the implanted phosphorus ions ($^{31}P+$) to form the drain regions 41, and the photo-resist film is removed. In this case, the field oxidized film 61, the floating gates 33 and the control gates 38 are used as a mask, and the source regions 36 and the drain regions 41 are formed in the upper portions of the substrate 31 in self alignment on condition that each source region 36 is adjacent to ends of one pair of floating gates 33 and ends of one pair of control gates 38 and each drain region 41 is adjacent to other ends of one pair of control gates 38.

Thereafter, as shown in FIG. 15, the insulating film 42A made of an oxidized film having a film thickness of about 2000 Å is formed on the entire surface of the substrate 31 according to the CVD method. Thereafter, as shown in FIG. 16, a photo-resist film 43 having a plurality of opening areas 43A is formed on the entire surface of the substrate 31. These opening areas 43A are formed in positions in which the formation of the contact holes 62 and 64 is planned (refer to FIGS. 10 and 11).

Thereafter, the insulating film 42A exposed to a bottom of the each opening area 43A and the insulating film 37 are etched and removed. Therefore, as shown in FIG. 16, an upper surface of each drain region 41 is exposed, and a pair of side wall spacer films 42 are formed for each drain region 41. The side wall spacer films 42 have a width between the sidewall spacer films 42 ranges from about 1000 Å to about 4000 Å and a height from the first impurity diffusing region 41 to a portion of the third insulating film 39 ranges from about 4000 Å to about 6000 Å. Thereafter, the resist film 43 is removed.

Next, a process for forming the electrode wiring film 48A making contact with the drain region 41 placed in a concave area between a pair of convex portions is described. Each convex portion denotes a lamination of the insulating film 37, the control gate 38 and the insulating film 39 arranged in that order in the flash memory. In this embodiment, a height of each convex portion is set to about 5000 Å, a width between the convex portions is set to about 0.4 μm (4000 Å).

As shown in FIG. 17, the first polysilicon film 45 is formed on the entire surface of the substrate 31 at a film thickness ranging from about 200 Å to about 500 Å according to the CVD method, an n-type impurity such as arsenic ions ($^{75}$As+) is implanted into the first polysilicon layer 45 at a dose of $5.0*10^{15}$ cm$^2$ and an accelerating voltage ranging from 30 KeV to 100 KeV to sufficiently make the first polysilicon layer 45 conductive. In FIG. 18, a symbol x indicates an ion implanting condition.

As an optimum condition for the ion implantation, in cases where a film thickness of the first polysilicon layer 45 is, for example, 500 Å, arsenic ions ($^{75}$As+) are implanted into the first polysilicon layer 45 as a first ion implantation at a dose of $5.0*10^{15}$ cm$^{-2}$ and an accelerating voltage of 30 KeV, and arsenic ions ($^{75}$As+) are implanted into the first polysilicon layer 45 as a second ion implantation at a dose of $5.0*10^{15}$ cm$^{-2}$ and an accelerating voltage of 95 KeV. Therefore, a peak of a concentration distribution of the arsenic ions in the first ion implantation is positioned at the center of the first polysilicon layer 45, and a peak of a concentration distribution of the arsenic ions in the second ion implantation is positioned at an interface between a bottom portion of the first polysilicon layer 45 and the semiconductor substrate 31. Accordingly, contact resistances in various portions of the first polysilicon layer 45 can be uniformly set to a low value.

In this embodiment, arsenic ions ($^{75}$As+) are used as the n-type impurity. However, it is applicable that phosphorus ions ($^{31}$P+) be implanted into the first polysilicon layer 45.

Figure 19:
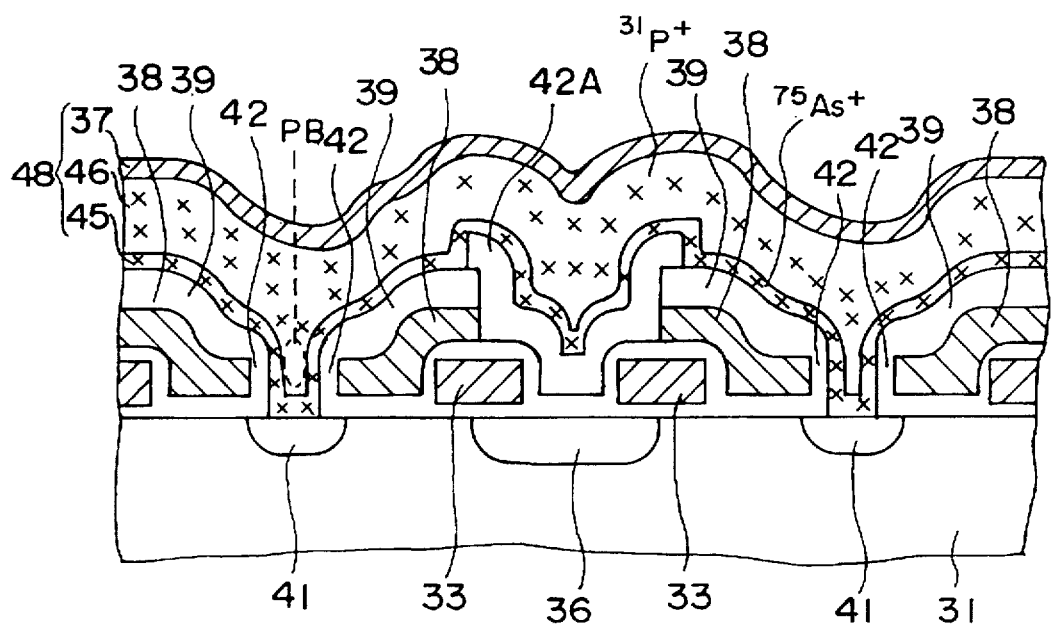
FIG. 19 is a ninth cross sectional view of the semiconductor apparatus in an eighth manufacturing process according to the second embodiment of the present invention.

As shown in FIG. 18, a second polysilicon film 46 is formed on the entire surface of the semiconductor apparatus according to the CVD method at a film thickness ranging from about 2000 Å to about 3000 Å sufficiently larger than that in the first polysilicon film 45, and an n-type impurity such as phosphorus ions ($^{31}$P+) is implanted into the second polysilicon film 46 at a dose of $5.0*10^{15}$ cm$^{-2}$ and an accelerating voltage of 60 KeV. Therefore, the second polysilicon film 46 is made conductive. In this case, the second polysilicon film 46 is sufficiently thickened, so that any narrowed convex portion is not formed on the second polysilicon film 46. Thereafter, as shown in FIG. 19, a tungsten silicide (WSix) film 47 having a film thickness of 1000 Å is formed on the entire surface of the second polysilicon film 46. Therefore, the two-layer structured electrode wiring film 48 composed of a combination of the first and second polysilicon films 45 and 46 and the tungsten silicide (WSix) film 47 is formed. In this case, it is applicable that arsenic ions ($^{75}$As+) be used as the n-type impurity in place of the phosphorus ions ($^{31}$P+).

In this embodiment, after the first polysilicon film 45 is sufficiently made conductive, the second polysilicon film 46 is formed on the first polysilicon film 45, and the n-type impurity is implanted into the second polysilicon film 46 to made the second polysilicon film 46 conductive. Therefore, as shown in FIG. 19, even though the implantation of the phosphorus ions ($^{31}$P+) into the second polysilicon film 46 is not sufficiently performed and the phosphorus ions ($^{31}$P+) Io do not reach a bottom portion PB of the second polysilicon film 46 (refer to the symbol x indicating the ion implanting condition in FIG. 19), because the phosphorus ions ($^{31}$P+) Io sufficiently reach portions of the second polysilicon film 46 close to upper ends of the side wall spacer films 42A, the portions of the second polysilicon film 46 can be electrically connected with the n+ type impurity diffusing region 41 through the first polysilicon film 45 and the second polysilicon film 46.

Accordingly, in the prior art shown in FIG. 3, though a contact resistance of the polysilicon film 8A is increased because the n-type impurity does not sufficiently reach the bottom portion PB of the polysilicon film 8A and contact resistances of various portions of the polysilicon film 8A are not uniformly set because the n-type impurity does not uniformly implanted into the bottom portion PB of the polysilicon film 8A, this drawback can be prevented in this embodiment.

A material of the electrode wiring film 48 is not limited to a combination of polysilicon and tungsten silicide (WSix), and any material can be used for the electrode wiring film 48 on condition that a resistance value of the material is low and a contact resistance between the electrode wiring film 48 and an impurity diffusing region (the source region 36 or the drain region 41) is low.

Figure 20:
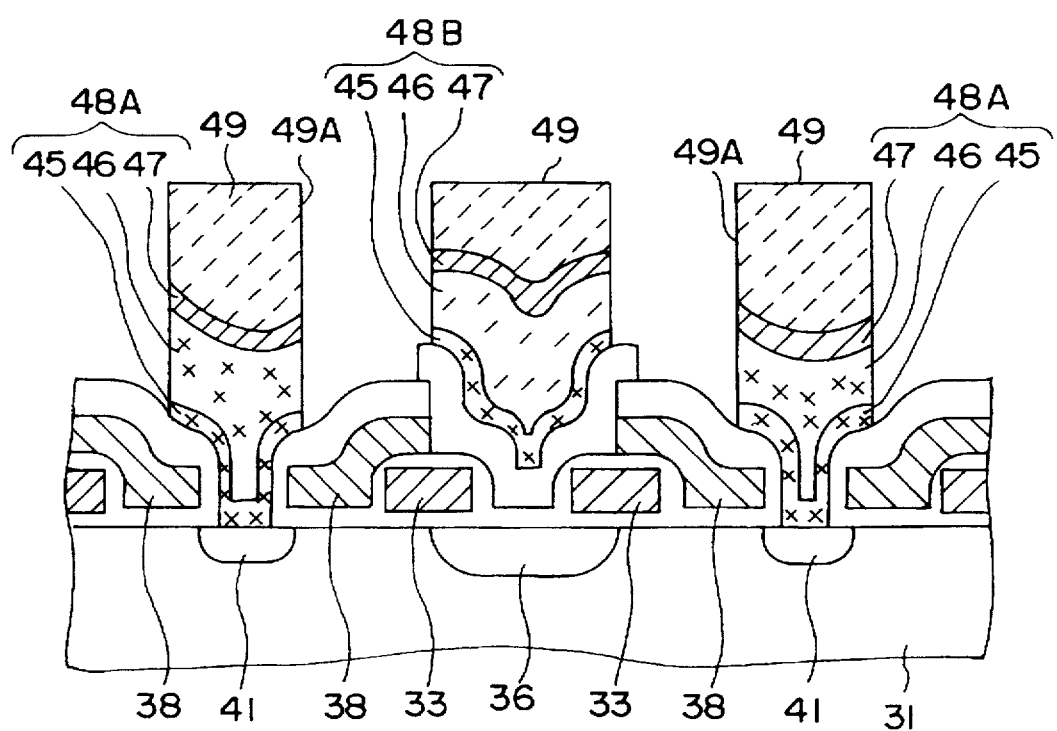
FIG. 20 is a tenth cross sectional view of the semiconductor apparatus in a ninth manufacturing process according to the second embodiment of the present invention.

Thereafter, as shown in FIG. 20, the photo-resist film 49 having the plurality of opening areas 49A on the electrode wiring film 48 is formed, portions of the electrode wiring film 48 not covered with the photo-resist film 49 are etched, the first electrode wiring films 48A making contact with the drain regions 41 and the second electrode wiring films 48B making contact with the source regions 36 through the contact holes 62 formed in the insulating films 37 and 42A.

Figure 21:
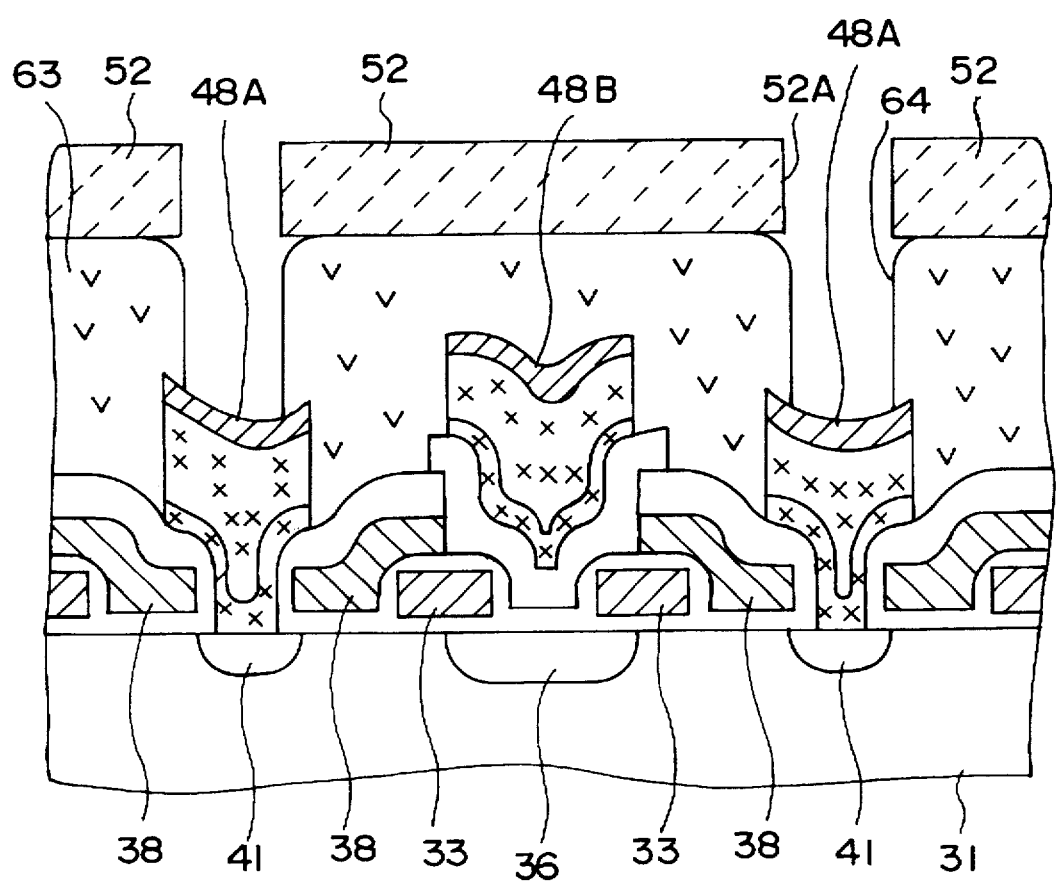
FIG. 21 is an eleventh cross sectional view of the semiconductor apparatus in a tenth manufacturing process according to the second embodiment of the present invention.

Thereafter, as shown in FIG. 21, the inter-layer insulating film 63 made of boron-phoso silicate glass is formed on the entire surface of the substrate 31 and is thermal-processed, a photo-resist film 52 having a plurality of opening areas 52A is formed on the inter-layer insulating film 63, and the contact holes 64 are opened in portions of the inter-layer insulating film 63 placed on the first electrode wiring films 48A. Thereafter, as shown in FIG. 10, an aluminum film (or an Al-Si-Cu film) is deposited on the entire surface of the substrate 31, so that the aluminum film electrically connected with the first electrode wiring films 48A through the contact holes 64 is formed. Thereafter, the aluminum film is patterned to form the metal wiring film 65. Therefore, the manufacturing of the non-volatile semiconductor storing apparatus according to the method of the second embodiment is completed.

Another manufacturing method for manufacturing a semiconductor apparatus according to another embodiment is described.

The first polysilicon film 45 is formed in the same manner as in the second embodiment, and the ion implantation is performed for the first polysilicon film 45. Thereafter, the second polysilicon film 46 is formed in the same manner as in the second embodiment, and the ion implantation is performed for the second polysilicon film 46. In this case, even though a total film thickness of the first and second polysilicon films 45 and 46 is the same as that of the polysilicon film 8A in the prior art, a contact resistance is not increased, and contact resistances in various portions of the first and second polysilicon films can be uniformly set.

Figure 1:
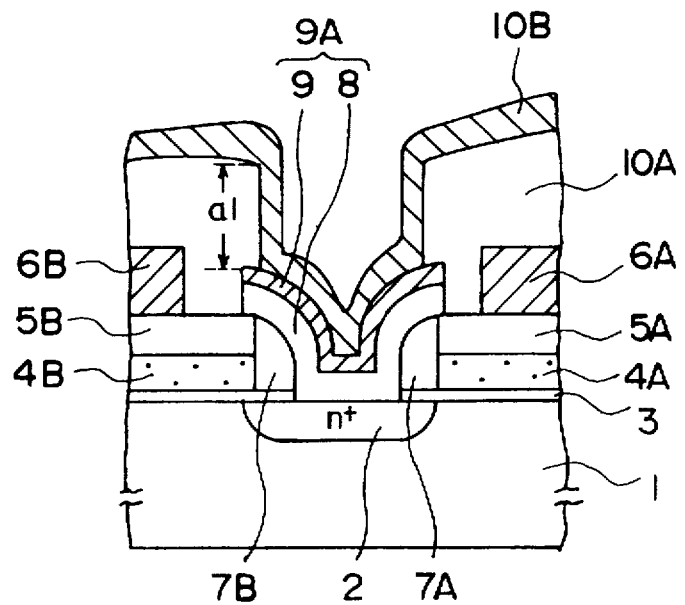
FIG. 1 is a cross sectional view of a conventional semiconductor apparatus.
Figure 2:
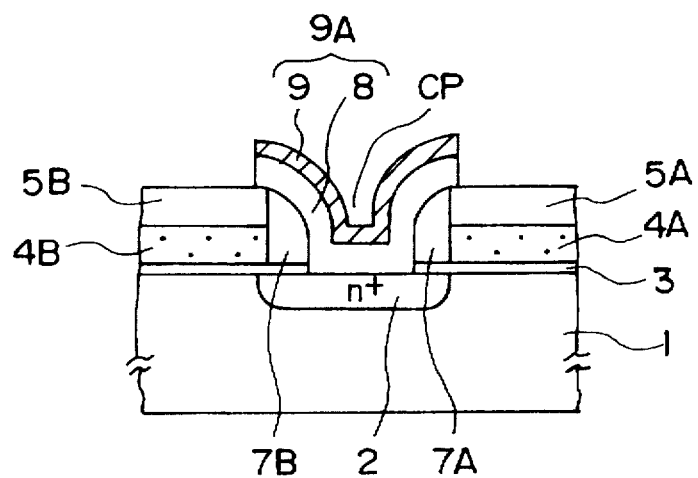
FIG. 2 is a first cross sectional view of the conventional semiconductor apparatus in a manufacturing step to explain a drawback in a manufacturing method of the conventional semiconductor apparatus.

Accordingly, in the prior art shown in FIG. 2, the ravine area CP is formed on the tungsten silicide (WSix) film 9 so that a resist-film used for the patterning of the tungsten silicide (WSix) film 9 undesirably remains in the ravine area CP or a halation occurs in cases where an intensity of the exposing light is increased to prevent the resist-film undesirably remain in the ravine area CP. Therefore, the patterning of the tungsten silicide (WSix) film 9 cannot be correctly performed in the prior art. However, in this embodiment, any narrowed concave area is not formed on the second polysilicon film 46 because the second polysilicon film 46 is sufficiently thickened. Therefore, the patterning of the electrode wiring film 48A can be correctly performed.

Also, as shown in FIG. 10, a height of the electrode wiring film 48A composed of the combined polysilicon film (the polysilicon films 45 and 46) and the tungsten silicide (WSix) film 47 can be heightened, and a height a3 of a side wall of the inter-layer insulating film 63 facing an opening area placed on the electrode wiring film 48A can be lowered than the height a1 of the side wall of the inter-layer insulating film 10A in the prior art (a3<a1). Therefore, a step coverage of the metal wiring film 65 formed along the side wall of the inter-layer insulating film 63 is not degraded.

In this embodiment, the electrode wiring film 48A is formed by laminating the combined polysilicon film (the polysilicon films 45 and 46) and the tungsten silicide (WSix) film 47. However, it is applicable that an electrode wiring film be formed by laminating the combined polysilicon film and a silicide film other than the tungsten silicide (WSix) film.

Also, in this embodiment, the height of each convex portion is set to about 5000 Å, the width between the convex portions is set to about 0.4 µm (4000 Å), the first polysilicon film 45 is set to the film thickness ranging from 200 Å to 500 Å, and the second polysilicon film 46 is set to the film thickness ranging from 2000 Å to 3000 Å. However, this embodiment is not limited these values. For example, in cases where the height of each convex portion is ranged from 4000 Å to 6000 Å and the width between the convex portions is ranged from 0.1 µm to 0.4 µm (1000 Å to 4000 Å), the same effects as those in the second embodiment can be obtained on condition that the heights of the first and second polysilicon films 45 and 46 are the same as those in the second embodiment. Also, even though the height of each convex portion and the width between the convex portions are changed, in cases where the heights of the first and second polysilicon films 45 and 46 are adjusted according to the changed height of each convex portion and the changed width between the convex portions and ion implanting conditions are adjusted according to the adjusted heights of the first and second polysilicon films 45 and 46, the same effects as those in the second embodiment can be obtained.

Also, in this embodiment, the concept of the present invention is applied for the split gate type flash memory representing the non-volatile semiconductor storing unit. However, it is applicable that the concept of the present invention be applied for a stack gate type flash memory.

What is claimed is:

1. A method for manufacturing a semiconductor apparatus, comprising the steps of:

forming a first insulating film (32) on a semiconductor substrate (31);

forming a first conductive film on a portion of the first insulating film (32) as a floating gate (33);

forming a second insulating film (37) to cover an upper portion of the floating gate and a side portion of the floating gate (33) with the second insulating film;

forming a second conductive film (38A) on a surface of the first insulating film (32) and a surface of the second insulating film (37);

forming a third insulating film (39) on the second conductive film (38A);

patterning the third insulating film (39) and the second conductive film (38A), on condition that a portion of a patterned third insulating film (39) and a portion of a patterned second conductive film (38A) are placed on the floating gate (33) through the second insulating film (37), to form the patterned second conductive film (38A) as a control gate (38);

introducing impurity into two upper portions of the semiconductor substrate respectively not covered with a mask, which is composed of the floating gate (33) and the control gate (38), to form a first impurity diffusing region and a second impurity diffusing region (36,41) in the upper portions of the semiconductor substrate placed on both sides of the mask, forming a fourth insulating film (42A) on the surface of the second insulating film (37) and a surface of the third insulating film (39);

forming a resist film (43) on a portion of the fourth insulating film (42A) placed on the first impurity diffusing region (36);

etching the other portion of the fourth insulating film (42A) and the portion of the second insulating film (37) placed beneath the other portion of the fourth insulating film (42A) while using the resist film (43) as a resist mask to expose the second impurity diffusing region (41) and form a pair of side wall spacer films (42) composed of a portion of the first insulating film covering a portion of the second impurity diffusing region (41) and a portion of the fourth insulating film covering a side wall of the control gate (38);

forming a first polysilicon film (45) on a surface of the second impurity diffusing region (41), the surface of the third insulating film (39) and a surface of the fourth insulating film (42A);

implanting ions into the first polysilicon film (45) to make the first polysilicon film (45) conductive;

forming a second polysilicon film (46) having a second film thickness larger than a first film thickness of the first polysilicon film (45) on the first polysilicon film (45);

implanting ions into the second polysilicon film (46) to make the second polysilicon film (46) conductive;

forming a silicide film (47) on the second polysilicon film (46); and patterning the silicide film (47), the second polysilicon film (46) and the first polysilicon film (45) to form an electrode wiring film (48) composed of a patterned silicide film (47), a patterned second polysilicon film (46) and a patterned first polysilicon film (45).

2. A method for manufacturing a semiconductor apparatus according to claim 1, wherein the first film thickness of the first polysilicon film (45) ranges from about 200 Å to about 500 Å and the second film thickness of the second polysilicon(46) film ranges from about 2000 Å to about 3000 Å.

3. A method for manufacturing a semiconductor apparatus according to claim 1, further comprising the step of forming said side wall spacer films (42) on condition that a width between said side wall spacer films (42) ranges from about 1000 Å to about 4000 Å, wherein a height from the first impurity diffusing region (41) to a portion of the third insulating film (39) ranges from about 4000 Å to about 6000 Å.

4. A method for manufacturing a semiconductor apparatus according to claim 1, wherein the silicide film is made of tungsten silicide (47).

* * * * *